(12) United States Patent
Jhong et al.

(10) Patent No.: US 8,083,463 B2
(45) Date of Patent: Dec. 27, 2011

(54) MINI CLEAN ROOM FOR PREVENTING WAFER POLLUTION AND USING METHOD THEREOF

(75) Inventors: Jhin-Siang Jhong, Hualien County (TW); Jen Jui Cheng, Taipei (TW); Chen Lung Huang, Hsinchu County (TW)

(73) Assignee: Inotera Memories, Inc., Taoyuan County (TW)

( * ) Notice: Subject to any disclaimer, the term of this patent is extended or adjusted under 35 U.S.C. 154(b) by 587 days.

(21) Appl. No.: 12/269,309

(22) Filed: Nov. 12, 2008

(65) Prior Publication Data

US 2010/0068010 A1 Mar. 18, 2010

(30) Foreign Application Priority Data

Sep. 17, 2008 (TW) .............................. 97135573 A

(51) Int. Cl.
*H01L 21/677* (2006.01)

(52) U.S. Cl. ................... 414/805; 414/217; 414/222.02; 414/222.12; 414/806; 414/939

(58) Field of Classification Search .................. 414/217, 414/222.01, 222.02, 222.12, 226.05, 744.2, 414/744.3, 805, 806, 939; 901/27
See application file for complete search history.

(56) References Cited

U.S. PATENT DOCUMENTS

| | | | |
|---|---|---|---|
| 7,874,781 B2 * | 1/2011 | Nozawa et al. | 414/217 |
| 2005/0053456 A1 * | 3/2005 | Ackeret et al. | 414/935 |
| 2005/0238464 A1 * | 10/2005 | Matsuoka et al. | 414/217 |
| 2006/0182529 A1 * | 8/2006 | Hiroki | 414/217 |

* cited by examiner

*Primary Examiner* — Scott Lowe

(74) *Attorney, Agent, or Firm* — Rosenberg, Klein & Lee

(57) ABSTRACT

A mini clean room for preventing wafer pollution includes a robot arm, a clean room body slidably disposed on the robot arm and at least one lock unit which is rotatably connected with the clean room body. During operation, the robot arm extends out of the clean room body to carry a wafer waiting to be processed, and then moves back into the clean room body which can provide an isolated and protected space for the wafer to avoid that the wafer is polluted. The present invention also discloses a method of using a mini clean room for preventing wafer pollution.

8 Claims, 4 Drawing Sheets

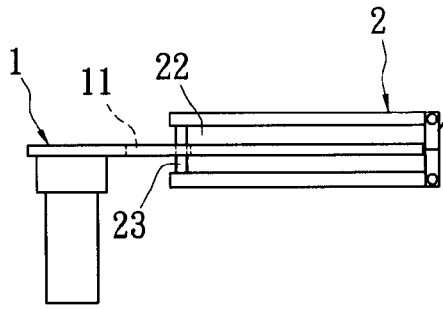
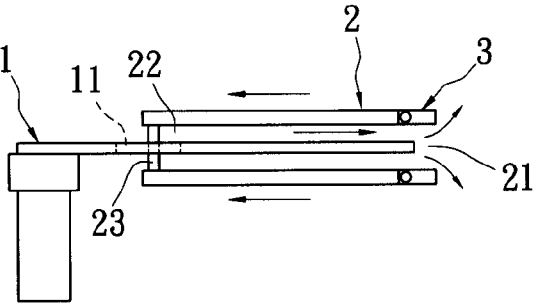
FIG. 4A                FIG. 4B
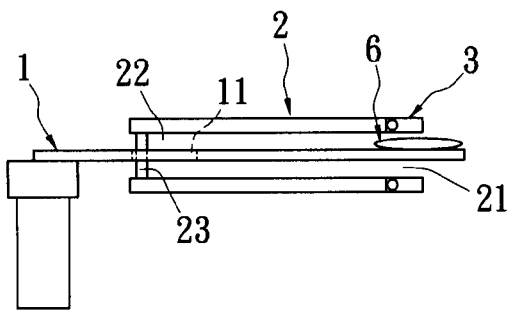
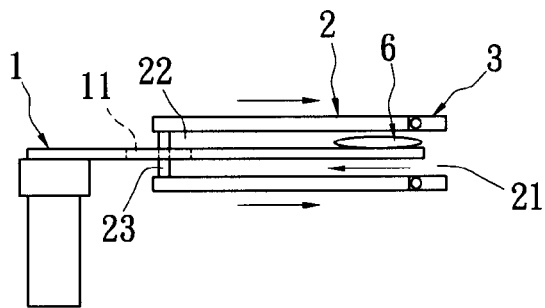
FIG. 4C                FIG. 4D
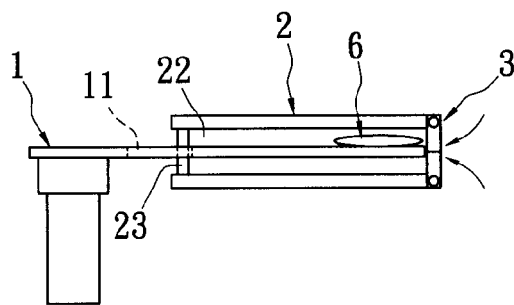
FIG. 4E

US 8,083,463 B2

MINI CLEAN ROOM FOR PREVENTING WAFER POLLUTION AND USING METHOD THEREOF

BACKGROUND OF THE INVENTION

1. Field of the Invention

The present invention relates to a sealing protection structure and using method thereof, and more particularly to a mini clean room for preventing wafer pollution and using method thereof.

2. Description of Related Art

At present, a semiconductor process includes various complex procedures, such as repeated oxidation, diffusion, lithography, etching, physical or chemical vapor deposition and so on. For improving precision of semiconductor processes, almost all procedures are designed to be performed under automatic control. Please refer to FIG. 1 illustrating a robot arm carrying a wafer. After the wafer 4a is processed on machine station 1a in one procedure, the robot arm 3a receives the wafer 4a and carries it to another machine station 2a for the next procedure. Owing to the robot arm 3a, dust and errors caused by manual operation, which influence the yield of the wafer manufacturing process, can be avoided.

However, the transportation of the robot arm has the shortcomings as follows:

1. When the robot arm takes the wafer out of one machine station, the wafer carried by the robot arm is completely exposed to the environment, so it is possible that particles in the atmosphere pollute the wafer on the robot arm during transportation.

2. If the wafer becomes polluted during transportation by the robot arm, this will influence the next production step.

The inventors of the present invention believe that the shortcomings described above can be improved and suggest the present invention which is of a reasonable design and is an effective improvement based on deep research and thought.

SUMMARY OF THE INVENTION

An object of the present invention is to provide a mini clean room for preventing wafer pollution which has an isolating and protecting function and is used during transportation of a wafer between machining stations to avoid that particles pollute the wafer during transportation.

Another object of the present invention is to provide a mini clean room disposed on a robot arm which is used for providing a completely sealed space so that a wafer carried by the robot arm can be protected completely when the robot arm moves.

To achieve the above-mentioned objects, a mini clean room for preventing wafer pollution in accordance with the present invention is provided. The mini clean room for preventing wafer pollution includes: a robot arm; a clean room body which is slidably disposed on one end of the robot arm and has an opening through which the robot arm extends out of the clean room body; and at least one lock unit which is pivotingly disposed on the clean room body and adjacent to the opening to selectively close the opening.

The present invention also provides a method of using a mini clean room for preventing wafer pollution, wherein the mini clean room includes a robot arm, a clean room body slidably disposed on one end of the robot arm and at least one lock unit, and the clean room body has an opening and the lock unit is pivotingly disposed on the clean room body. The method includes the steps of: the robot arm transmitting a trigger signal to the lock unit; receiving the trigger signal, the lock unit opening the opening of the clean room body and the robot arm extending out of the opening and receiving a wafer; and the robot arm moving back to an initial position and transmitting the trigger signal to the lock unit again to cause the lock unit to close the opening for sealing the clean room body thereby avoiding that the wafer carried by the robot arm is polluted by particles during transportation.

Consequently, the mini clean room for preventing wafer pollution and its method of the present invention has the following benefits:

When used, the present invention is easy to stay in the sealed state to block external pollution, thereby avoiding that the wafer is polluted by particles to result in the failure of the manufacturing process and production loss. Additionally, the wafer on the robot arm can be transported under completely closed condition during the process to avoid being polluted during transportation and influencing the processing effects.

To further understand technologies, methods and efficacy of the present invention, please refer to the following detailed description and drawings related the present invention, and it is believed that the objects, characteristics and features of the present invention can be further understood. However, the drawings are only to be used as references and explanations, not to limit the present invention.

BRIEF DESCRIPTION OF THE DRAWINGS

FIG. 4A is an action schematic view (1) of the mini clean room for preventing wafer pollution of the present invention in a use state;

FIG. 4B is an action schematic view (2) of the mini clean room for preventing wafer pollution of the present invention in the use state;

FIG. 4C is an action schematic view (3) of the mini clean room for preventing wafer pollution of the present invention in the use state;

FIG. 4D is an action schematic view (4) of the mini clean room for preventing wafer pollution of the present invention in the use state; and FIG. 4E is an action schematic view (5) of the mini clean room for preventing wafer pollution of the present invention in the use state.

DETAILED DESCRIPTION OF PREFERRED EMBODIMENTS

Figure 1:
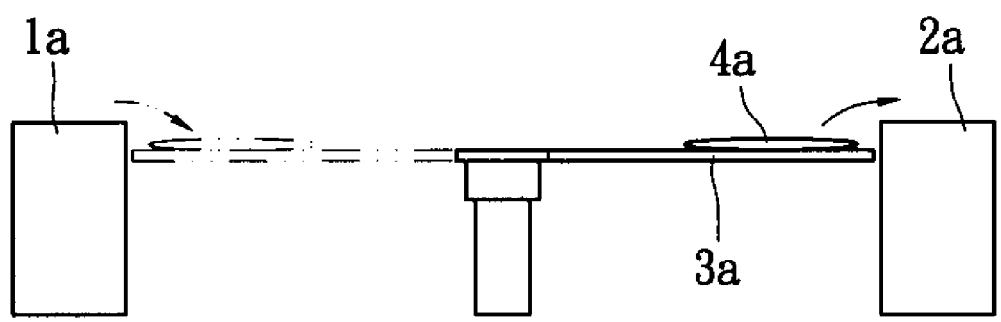
FIG. 1 is a system-structural schematic view of a conventional robot arm.
Figure 2A:
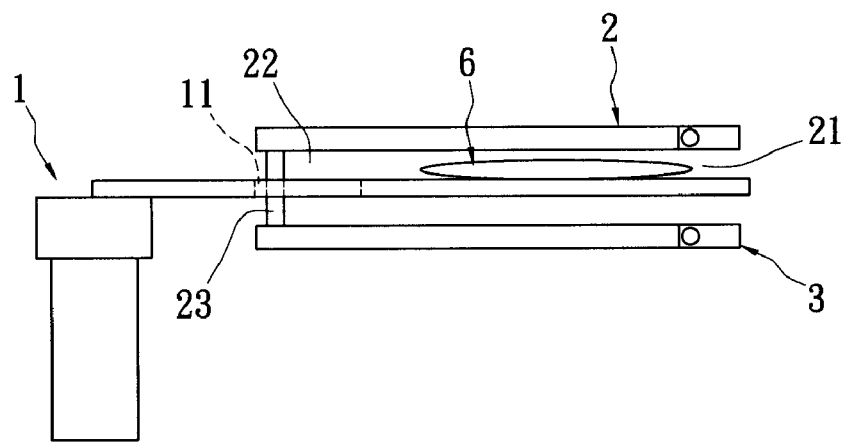
FIG. 2A is a structural schematic view of a mini clean room for preventing wafer pollution of the present invention.

Please refer to FIG. 2A, a mini clean room for preventing wafer pollution according to the present invention includes a robot arm 1, a clean room body 2 and a lock unit 3. The clean room body 2 is slidably disposed on the robot arm 1 and the lock unit 3 is rotatably connected with the clean room body 2.

Figure 2B:
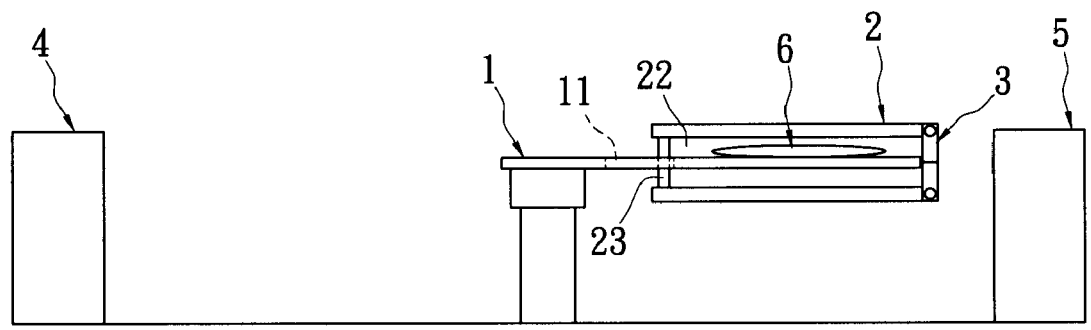
FIG. 2B is a system-structural schematic view of the mini clean room for preventing wafer pollution of the present invention.
Figure 2C:
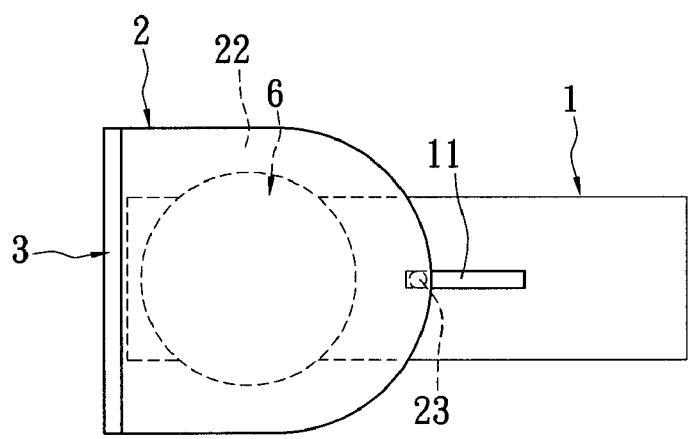
FIG. 2C is a top view of the mini clean room for preventing wafer pollution of the present invention.

The robot arm 1 is located between a machining station 4 and another machining station 5 (as shown in FIG. 2B) for carrying a wafer from the machining station 4 to the machining station 5 to process the wafer. The robot arm 1 has a sliding groove 11 (as shown in FIG. 2C) which extends through the robot arm 1, and the clean room body 2 disposed on the robot arm 1 is movably connected with the sliding groove 11 so that the clean room body 2 can move on the robot arm 1. Additionally, it needs to be mentioned that the robot arm 1 carries one piece of wafer 6 each time.

The clean room body 2 is a storage container and disposed on one end of the robot arm 1 for providing a receiving and protecting space for one portion of the robot arm 1. The clean room body 2 has an opening 21, a receiving space 22 and a sliding element 23. The opening 21 is connected with the receiving space 22, and the robot arm 1 received in the receiving space 22 may extend out of the clean room body 2 through the opening 21 for carrying the wafer 6. After the robot arm 1 moves back into the receiving space 22, the receiving space 22 of the clean room body 2 may also form a receiving and protecting space so that the clean room body 2 can keep external particles outside and thus protect the wafer 6 carried by the robot arm 1 from being polluted.

The clean room body 2 is not limited to any particular shape and may be circular, near circular or rectangular, so semiconductor manufactories can design the shape of the clean room body 2 according to demands.

Furthermore, the sliding element 23 is disposed on one end of the clean room body 2 which is far away from the opening 21, and movably inserted in the sliding groove 11 of the robot arm 1, whereby the clean room body 2 can move on the robot arm 1 freely to cooperate with the operation of the robot arm 1 and ensure that the robot arm 1 can extend out of or move back into the clean room body 2 quickly.

Accordingly, more concretely, when the robot arm 1 extends towards the opening 21, the clean room body 2 moves in the direction opposite to the direction in which the robot arm 1 is moving so that one end of the robot arm 1 can pass through the opening 21 quickly and extend out of the clean room body 2; when the robot arm 1 moves back, the clean room body 2 moves in the direction opposite to the direction in which the robot arm 1 is moving so that one end of the robot arm 1 can be received in the receiving space 22 of the clean room body 2 quickly, whereby the clean room body 2 provides an isolating and protecting function.

The lock unit 3 is pivotingly disposed on the clean room body 2, adjacent to the opening 21 of the clean room body 2. The lock unit 3 is used for selectively closing the clean room body 2, thereby the clean room body 2 can further form a completely isolated and protected space. The lock unit 3 may be in the form of a sealing plate to open or close the opening 21 according to the operating states of the robot arm 1. Additionally, the number of lock units 3 is not limited, and may be one, two, three or four depending on the demand, and in the embodiment, the number of lock units 3 is two.

Besides, the lock unit 3 is further electrically connected with the robot arm 1. When the robot arm 1 works, the lock unit 3 can receive a trigger signal from the robot arm 1 and then work to cooperate with the operation of the robot arm 1, so that one end of the robot arm 1 extends out of or moves back into the clean room body 2. The lock unit 3 may be electrically connected with the robot arm 1 via wire connection or wireless connection.

Figure 3:
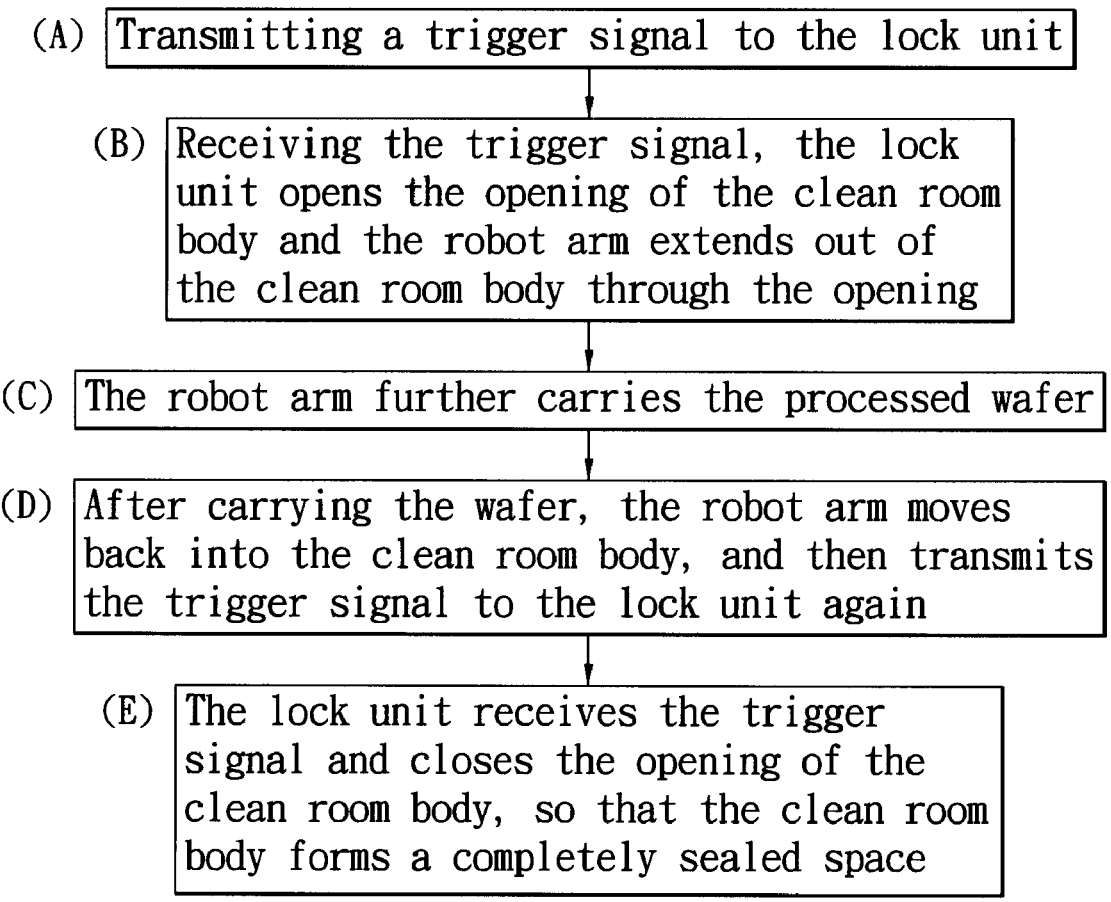
FIG. 3 is a flow chart of a method of using a mini clean room for preventing wafer pollution of the present invention.

Please refer to FIG. 3, the present invention provides a method of using a mini clean room for preventing wafer pollution, which includes the steps as follows (as shown in FIGS. 4A-4E):

(A). The robot arm 1 starts to work and transmits a trigger signal to the lock unit 3;

(B). The lock unit 3 receives the trigger signal and starts to work to open the opening 21 of the clean room body 2, so that the robot arm 1 extends out of the clean room body 2 through the opening 21;

(C). The robot arm 1 extending out of the clean room body 2 further carries the processed wafer 6;

(D). After carrying the wafer 6, the robot arm 1 moves back into the clean room body 2 and then transmits the trigger signal to the lock unit 3 again;

(E) The lock unit 3 receives the trigger signal again and starts to work to close the opening 21 of the clean room body 2, so that the wafer 6 carried by the robot arm 1 can be completely sealed and protected.

For helping those skilled in the art understand and implement the present invention, the method of the present invention will be described in detail herein. Please refer to FIGS. 4A-4E, after being processed on a station (not shown) in one procedure, the wafer 6 needs to be transported to another station (not shown) for a next procedure, so the robot arm 1 starts to work and transmits the trigger signal to the lock unit 3. The lock unit 3 receives the trigger signal and then starts to work to open the opening 21 of the clean room body 2.

Then, the robot arm 1 starts to extend out of the clean room body 2 to carry the wafer 6. While the robot arm 1 extends, the clean room body 2 moves in the direction opposite to the direction in which the robot arm 1 extends to accelerate the extending of one end of the robot arm 1, thereby the robot arm 1 carries the wafer 6 easily.

Once carrying the wafer 6, the robot arm 1 starts to move back into the clean room body 2. At the same time, the clean room body 2 moves in the direction opposite to the direction in which the robot arm 1 is moving, thereby one end of the robot arm 1 can move back into the opening 21 quickly.

After moving back to the initial position, the robot arm 1 transmits the trigger signal to the lock unit 3 again, and the lock unit 3 which receives the trigger signal works to close the opening 21 of the clean room body 2, so that the clean room body 2 forms a completely sealed space. Additionally, the trigger signal is used for controlling the lock unit 3 with respect to opening or closing.

When the lock unit 3 closes the opening 21 completely, the wafer 6 carried by the robot arm 1 can be isolated and protected completely during the transportation, thereby avoiding that particles pollute the wafer 6 to affect a next step.

Consequently, the mini clean room for preventing wafer pollution and using method thereof of the present invention has the advantages as follows:

1. The present invention provides a mini clean room with a simple structure to effectively avoid that particles pollute the wafer;

2. The wafer on the robot arm can be transported under the completely closed condition during the process, thereby avoiding that particles pollute the wafer 6 during transportation and influence the subsequent manufacturing process.

What are disclosed above are only the specification and the drawings of the preferred embodiment of the present invention. It will be understood by those skilled in the art that various equivalent changes may be made depending on the specification and the drawings of the present invention without departing from the scope of the present invention.

What is claimed is:

1. A method of using a mini clean room for preventing wafer pollution, wherein the mini clean room includes a robot arm, a clean room body slidably disposed on one end of the robot arm and at least one lock unit, the clean room body has an opening and the lock unit is pivotingly disposed on the clean room body, the method comprising the steps of:

transmitting a trigger signal from the robot arm to the lock unit;

in response to the trigger signal, the lock unit opening the clean room body and the robot arm extending out of the opening wherein the clean room body simultaneously moves in a direction opposite to the direction in which the robot arm moves so that the robot arm extends out of the opening quickly for receiving the wafer; and causing the robot arm moving back to an initial position and transmitting a trigger signal to the lock unit again to cause the lock unit to close the opening for sealing the clean room body, thereby preventing the wafer carried by the robot arm from being polluted by particles during transportation.

2. The method of using a mini clean room for preventing wafer pollution as claimed in claim 1, wherein the robot arm is located between two machining stations for carrying the wafer from one machining station to the other machining station.

3. The method of using a mini clean room for preventing wafer pollution as claimed in claim 1, wherein the trigger signal controls the lock unit with respect to opening or closing.

4. The method of using a mini clean room for preventing wafer pollution as claimed in claim 1, wherein, after receiving the wafer, the robot arm moves back to the initial position and transmits the trigger signal to the lock unit causing the lock unit to close the opening to seal the clean room body, wherein the clean room body simultaneously moves in a direction opposite to the direction in which the robot arm is moving, so that the robot arm moves back into the clean room body quickly.

5. A method of using a mini clean room for preventing wafer pollution, wherein the mini clean room includes a robot arm, a clean room body slidably disposed on one end of the robot arm and at least one lock unit, the clean room body has an opening and the lock unit is pivotingly disposed on the clean room body, the method comprising the steps of:

transmitting a trigger signal from the robot arm to the lock unit;

in response to the trigger signal, the lock unit opening the clean room body and the robot arm extending out of the opening to receive a wafer;

after receiving the wafer, causing the robot arm to move back to an initial position and transmit the trigger signal to the lock unit, causing the lock unit to close the opening to seal the clean room body, wherein the clean room body simultaneously moves in a direction opposite to the direction in which the robot arm is moving, so that the robot arm moves back into the clean room body quickly; and causing the lock unit to close the opening for sealing the clean room body, thereby preventing the wafer carried by the robot arm from being polluted by particles during transportation.

6. The method of using a mini clean room for preventing wafer pollution as claimed in claim 5, wherein the robot arm is located between two machining stations for carrying the wafer from one machining station to the other machining station.

7. The method of using a mini clean room for preventing wafer pollution as claimed in claim 5, wherein the trigger signal controls the lock unit with respect to opening or closing.

8. The method of using a mini clean room for preventing wafer pollution as claimed in claim 5, wherein as the lock unit opens the opening of the clean room body and the robot arm extends out of the opening to receive a wafer, the clean room body simultaneously moves in a direction opposite to the direction in which the robot arm moves so that the robot arm extends out of the opening quickly for receiving the wafer.

* * * * *